United States Patent
Lee et al.

(10) Patent No.: US 8,026,733 B2
(45) Date of Patent: Sep. 27, 2011

(54) INTERFACE STRUCTURE OF WAFER TEST EQUIPMENT

(75) Inventors: Sang-hoon Lee, Hwaseong-si (KR); Chang-woo Ko, Seoul (KR); Young-soo An, Yongin-si (KR); Se-jang Oh, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 88 days.

(21) Appl. No.: 12/455,445

(22) Filed: Jun. 2, 2009

(65) Prior Publication Data

US 2010/0117673 A1    May 13, 2010

(30) Foreign Application Priority Data

Nov. 11, 2008  (KR) .................. 10-2008-0111874

(51) Int. Cl.
*G01R 31/20* (2006.01)
(52) U.S. Cl. .......... 324/754.07; 324/754.01; 324/756.03
(58) Field of Classification Search .............. 324/754.01
See application file for complete search history.

(56) References Cited

U.S. PATENT DOCUMENTS

| | | | | |
|---|---|---|---|---|
| 5,070,297 A | * | 12/1991 | Kwon et al. | 324/754.03 |
| 5,568,054 A | * | 10/1996 | Iino et al. | 324/750.05 |
| 6,400,173 B1 | * | 6/2002 | Shimizu et al. | 324/754.07 |
| 6,483,328 B1 | * | 11/2002 | Eldridge et al. | 324/754.18 |
| 6,909,297 B2 | * | 6/2005 | Ji et al. | 324/754.07 |
| 6,932,642 B2 | * | 8/2005 | Beer et al. | 439/495 |
| 7,245,134 B2 | * | 7/2007 | Granicher et al. | 324/754.07 |
| 7,245,139 B2 | | 7/2007 | Miller | |
| 7,504,822 B2 | * | 3/2009 | Parrish et al. | 324/756.03 |
| 7,557,592 B2 | * | 7/2009 | Miller | 324/756.03 |
| 2005/0156611 A1 | | 7/2005 | Shinde et al. | |
| 2006/0125498 A1 | * | 6/2006 | Liu et al. | 324/754 |
| 2010/0026333 A1 | * | 2/2010 | Shouji | 324/761 |

FOREIGN PATENT DOCUMENTS

JP    2003-007781    1/2003

* cited by examiner

*Primary Examiner* — Huy Q Phan
*Assistant Examiner* — Richard Isla Rodas
(74) *Attorney, Agent, or Firm* — Onello & Mello, LLP

(57) ABSTRACT

A wafer test equipment system includes a performance board connected to a tester head of a tester. A universal block printed circuit board is positioned on the performance board, directly connecting a plurality of normal signal lines to a probe card and dividing each of a plurality of power signal lines into multiple paths and connecting them to the probe card. A cable assembly transfers the normal signal lines and the power signal lines between the universal block printed circuit board and the tester head. The cable assembly is soldered directly to the universal block printed circuit board in a perpendicular direction through a center portion of the performance board. A probe card is removably secured to the performance board including the universal block printed circuit board. The probe card includes an interposer on an upper surface thereof, a ceramic multi-layer substrate positioned below the interposer, and a plurality of needles positioned below the ceramic multi-layer substrate on a lower surface thereof opposite the upper surface.

12 Claims, 8 Drawing Sheets

INTERFACE STRUCTURE OF WAFER TEST EQUIPMENT

CROSS-REFERENCE TO RELATED APPLICATIONS

This application claims the benefit of Korean Patent Application No. 10-2008-0111874, filed on Nov. 11, 2008, in the Korean Intellectual Property Office, the disclosure of which is incorporated herein in its entirety by reference.

BACKGROUND

The inventive concept relates to wafer test equipment used for electrical testing of a wafer, and, more particularly, to an interface structure between a tester head and a probe card that is configured to be directly connected to a wafer under test.

During a manufacturing process, semiconductor devices are functionally tested to determine whether they operate within normal operating parameters or whether they are defective. For example, when a plurality of semiconductor chips are manufactured on a common wafer, it can be determined at that time whether the certain ones of the semiconductor chips are normal or defective through electrical die sort (EDS) testing, prior to dicing of the chips into individual components.

Test equipment used for electrical testing of the wafer is commonly referred to in industry as a "tester". The tester interfaces with a device under test (DUT) via a tester head, a performance board, and a probe card of a probe station.

A tester head includes a densely arranged plurality of signal terminals connected to a plurality of test channels. The test channels are thereby connected to the DUT to conduct electrical testing of the wafer. A plurality of needles are arranged in a lowermost portion of the probe card so that the probe card can be made to be in electrical contact with the semiconductor chip that is the DUT.

In this manner, the tester and the probe card of the probe station are used to conduct electrical testing of the wafer. Accordingly, the normal or defective status, for example, 'pass', 'repair', or 'reject' status of a plurality of chips on a wafer can be determined.

SUMMARY

An interface structure of wafer test equipment includes a configuration that is constructed and arranged to stably supply power and provide normal signal transfer characteristics during an electrical testing process of a wafer, while significantly reducing the weight and size of the probe card.

In one aspect, a wafer test equipment system includes a performance board connected to a tester head of a tester. A universal block printed circuit board is positioned on the performance board, directly connecting a plurality of normal signal lines to a probe card and dividing each of a plurality of power signal lines into multiple paths and connecting them to the probe card. A cable assembly transfers the normal signal lines and the power signal lines between the universal block printed circuit board and the tester head. The cable assembly is soldered directly to the universal block printed circuit board in a perpendicular direction through a center portion of the performance board. A probe card is removably secured to the performance board including the universal block printed circuit board. The probe card includes an interposer on an upper surface thereof, a ceramic multi-layer substrate positioned below the interposer, and a plurality of needles positioned below the ceramic multi-layer substrate on a lower surface thereof opposite the upper surface.

In one embodiment, the performance board and the probe card are electrically connected at a plurality of connection contact points at a lower surface of the universal block printed circuit board at a lower portion of the performance board, and the connection contact points correspond with interposer terminals of the interposer of the probe card on the upper surface of the probe card.

In another embodiment, the universal block printed circuit board has a matrix structure including a plurality of blocks of printed circuit patterns and each block includes the connection contact points that are provided on the lower surfaces of the printed circuit patterns.

In another embodiment, the normal signal lines and the connection contact points are directly connected to each other according to a 1:1 signal transfer ratio, and the power signal lines and the connection contact points are connected to each other according to a 1:N signal transfer ratio, where N is a whole number greater than 1.

In another embodiment, the probe card has a configuration that varies in accordance with the part type of a semiconductor device that is to be tested.

In another embodiment, the performance board and the probe card are removably secured to each other via levers of a ZIF connector at an outer portion of the probe card that surrounds the interposer.

In another embodiment, the probe card further comprises a support surrounding the ceramic multi-layer substrate; and the levers of the ZIF connector are positioned on the support.

In another embodiment, the power signal lines in the cable assembly are soldered directly to an upper surface of the universal printed circuit board of the performance board.

In another embodiment, the power signal lines in the cable assembly are connected to a conductive layer in a middle portion of the universal block printed circuit board.

In another embodiment, the normal signal lines in the cable assembly are soldered directly to an upper surface of the universal printed circuit board of the performance board In another embodiment, the normal signal lines in the cable assembly are connected to a conductive layer in a middle portion of the universal block printed circuit board, In another embodiment, the normal signal lines in the cable assembly are connected through the universal block printed circuit board.

In another embodiment, ground lines surround the outer portions of the power signal lines and the normal signal lines in the cable assembly, and are connected to ground conductive layers, respectively, formed on an upper surface and a lower surface of the universal block printed circuit board.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EMBODIMENTS

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the inventive concept to those skilled in the art.

Figure 1:
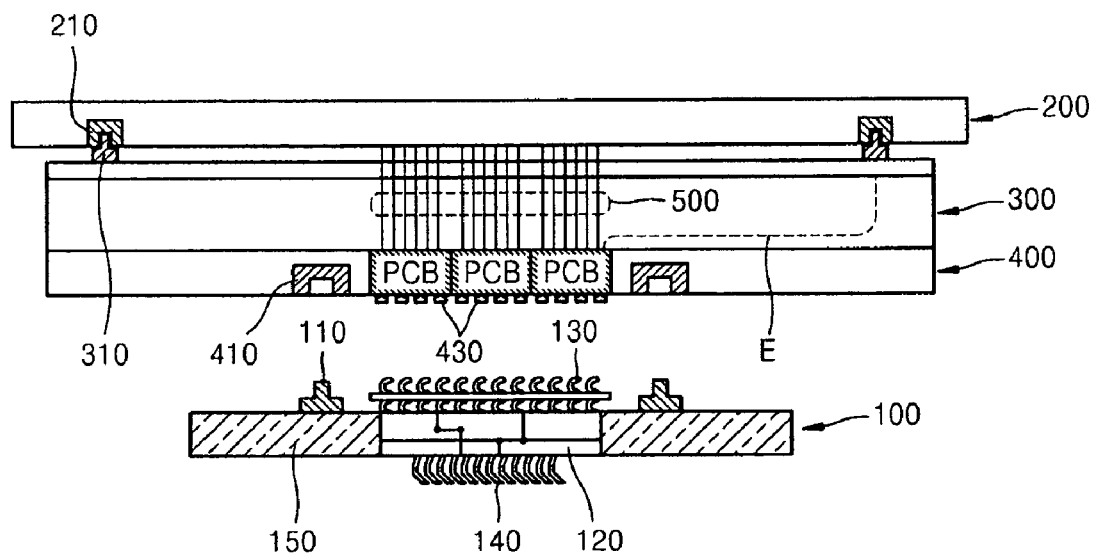
FIG. 1 is a cross-sectional view of an interface structure of wafer test equipment according to an embodiment of the inventive concept.

FIG. 1 is a cross-sectional view of an interface structure of wafer test equipment according to an embodiment of the inventive concept.

Referring to FIG. 1, the interface structure of the wafer test equipment in accordance with the present embodiment includes a performance board 300 constructed and arranged to be connected to a tester head 200. A universal block printed circuit board 400 that directly connects a normal signal line, such as data, address and control signal lines, and directly connects a power signal line that is divided into multiple paths is provided under the performance board 300.

The tester head 200 further includes a cable assembly 500 that passes through a center portion of the performance board 300 and is directly soldered to the universal block printed circuit board 400 in a perpendicular direction. The cable assembly 500 is not wired from an external location to a center portion via the power signal lines and normal signal lines used for electrical testing of a wafer, but rather, is directly wired from the tester head 200 to the universal block printed circuit board 400 along the relatively shortest distance between them as shown by dashed line E of FIG. 1. Accordingly, a shortest transfer path of the power signal lines and normal signal lines is provided, thereby providing for reliable transmission of the signals during high-speed testing of a semiconductor device.

The interface structure of the wafer test equipment further includes a probe card 100 that is attachable/detachable to/from the performance board 300 provided on the universal block printed circuit board 400. The probe card 100 comprises a plurality of interposers 130 positioned on an uppermost portion of the probe card 100, a ceramic multi-layer substrate 120 positioned below the interposers 130, a plurality of needles 140 positioned below the ceramic multi-layer substrate 120, and a support 150 surrounding the outer portions of the ceramic multi-layer substrate 120. The support 150 is suitably formed of a lightweight metal material, for example, stainless steel or aluminum.

Contemporary probe cards commonly comprise a printed circuit board. However, according to the present embodiment, the universal block printed circuit board 400 positioned below the performance board 300 comprises a printed circuit board and the probe card 100 that is attachable/detachable to/from the performance board 200 does not include a printed circuit board. As a result, the weight of the probe card 100 is reduced by about ⅓, and the size of the probe card 100 is reduced by about ¼, improving manual handling of the probe card 100 by an operator. In a conventional case where the probe card typically includes a printed circuit board, it is more difficult for the operator to manually handle the relatively large weight and size of the probe card. This increases the burden on an operator's body and operator's health during repeated handling. By reducing the size and weight of the probe card 100, manual handling of the probe card 100 can be performed in a more ergonomic fashion, without requiring the assistance of an additional carrying unit, thereby increasing operational efficiency during a testing process.

In addition, since the universal block printed circuit board 400 is adaptable to electrically connect and test a variety of types of semiconductor devices, different types of semiconductor devices can be tested by simply changing the configuration of the ceramic multi-layer substrate 120 included in the probe card 100.

Meanwhile, in the interface structure of the wafer test equipment according to the current embodiment of the inventive concept, the performance board 300 and the probe card 100 are physically connected to each other via levers 110 and 410 of ZIF sockets at the edge, or outer portions, of the probe card 100 and the universal block printed circuit board 400 of the performance board 300. The performance board 400 and the probe card 100 are electrically connected at a plurality of connection contact points 430 at a bottom portion of the universal block printed circuit board 400 below the performance board 300 where they contact a terminal of the interposer 130 positioned at a top surface of the probe card 100. Locking means 210 and 310 are provided at the tester head 200 and the performance board 300 to secure them to each other. In this manner, the probe card can be removably secured to the performance board 300.

Figure 2:
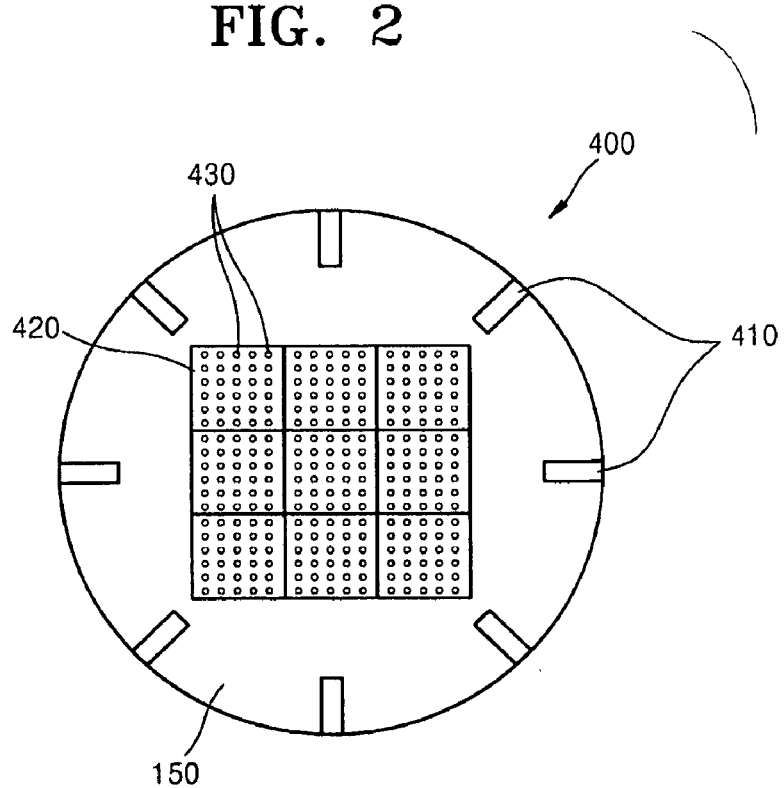
FIG. 2 is a bottom view of a universal block printed circuit board of FIG. 1.

FIG. 2 is a bottom view of the universal block printed circuit board 400 of FIG. 1.

Referring to FIG. 2, the universal block printed circuit board 400 is configured as a matrix structure including a plurality of blocks of printed circuit patterns 420 and associated connection contact points 430 that are used for external connection. The connection contact points 430 are provided under the printed circuit patterns 420. A plurality of levers 410 of a ZIF connector are positioned on the support 150 along the boundary portion of the printed circuit patterns 420 and physically connect and retain the universal block printed circuit board 400 and the probe card 100 of FIG. 1. Although the universal block printed circuit board 400 in the present example embodiment includes an array of nine printed circuit patterns 420 for descriptive convenience and understanding, the number of the printed circuit patterns 420 may vary, and the printed circuit patterns 420 can also have various modifications of arrangement, other than a matrix type of arrangement, as needed.

Figure 3:
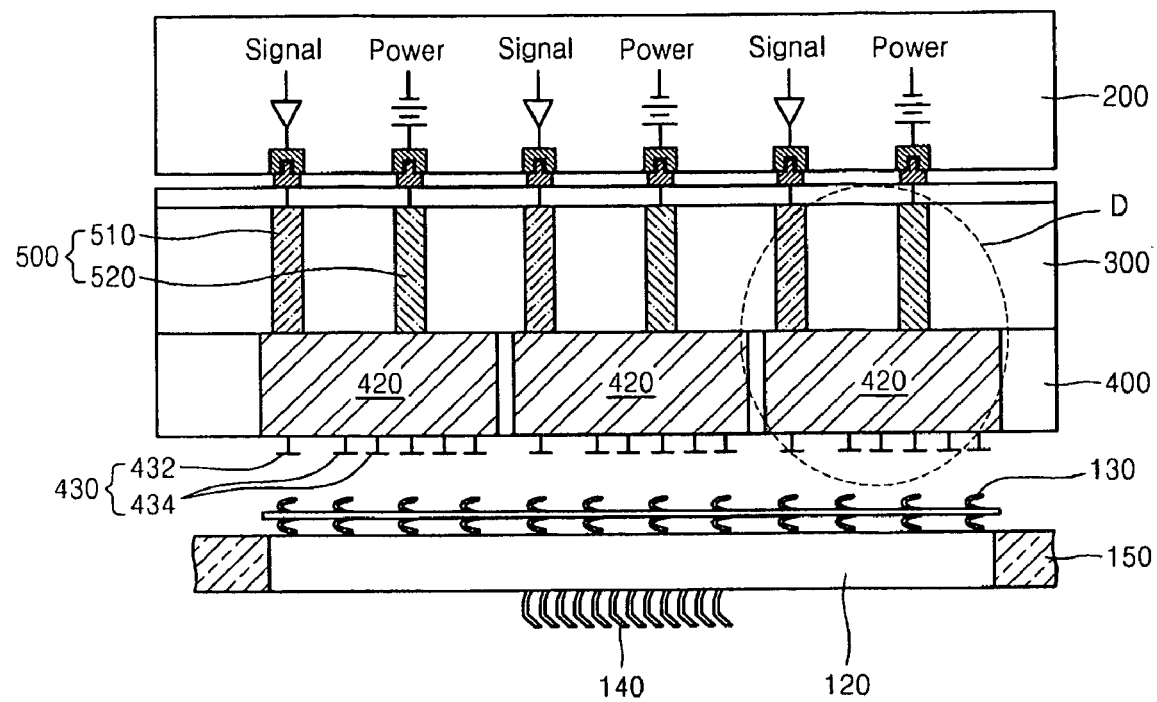
FIG. 3 is a cross-sectional view illustrating a path for connecting a plurality of normal signal lines and a plurality of power signal lines of a tester head to a semiconductor chip under test.
Figure 4:
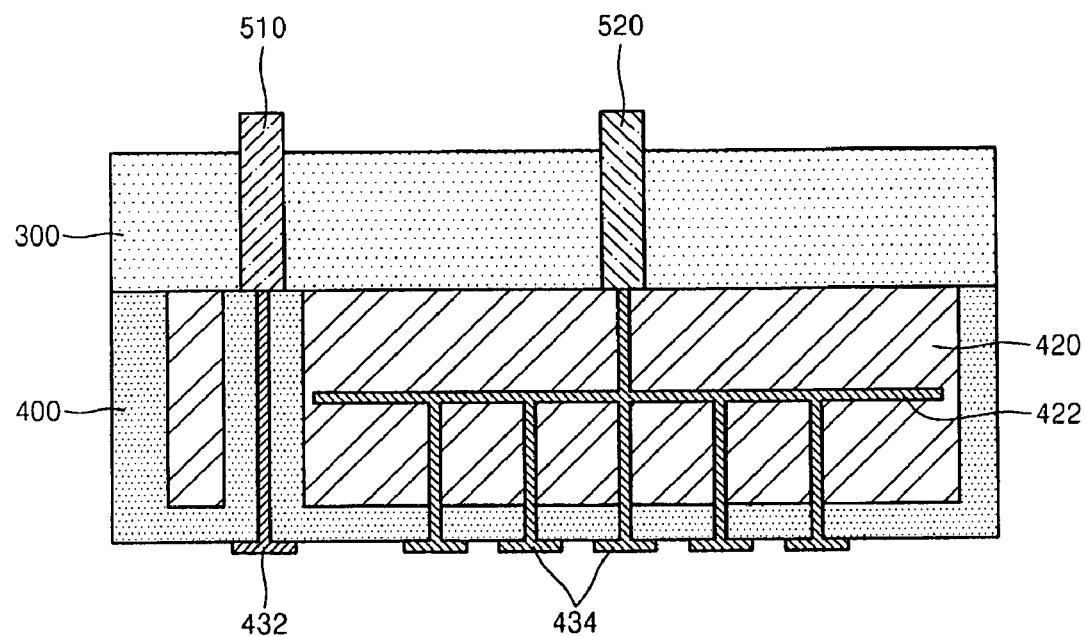
FIG. 4 is an expanded cross-sectional view of a portion D of FIG. 3 for illustrating a multi-drop structure of a plurality of power signal lines.

FIG. 3 is a cross-sectional view illustrating a path for connecting a plurality of normal signal lines 510 and a plurality of power signal lines 520 of a tester head to a semiconductor chip. FIG. 4 is an extended cross-sectional view of a portion D of FIG. 3 for explaining a multi paths structure of the power signal lines 520.

Referring to FIGS. 3 and 4, the cable assembly 500 that is directly soldered to the universal block printed circuit board 400 from the tester head 200 includes a plurality of power signal lines 520 and a plurality of normal signal lines 510. As illustrated in FIG. 4, the normal signal lines 510 are not divided into multiple paths in the printed circuit patterns 420 included in the universal block printed circuit board 400 but rather are directly connected to a plurality of connection contact points 432 by a ratio of 1:1. Meanwhile, the power signal lines 520 are divided into multiple paths in a conductive layer 422 of the printed circuit patterns 420 included in the universal block printed circuit board 400 and are connected to a plurality of connection contact points 434 by a ratio of 1:N. In FIG. 4, the number N of the connection contact points 434 for each power signal line is 5, however the number N can be adjusted according to the needs of a designer, for example, where N is less than or equal to 10.

In a case where the power signal lines 520 are divided into multiple paths and are arranged in a direction parallel to the interposers 130, the power signal lines 520 have a relatively small inductance as compared to the normal signal lines 510 that are not divided into multiple paths and are connected in serial to the connection contact points 432. Accordingly, the smaller the inductance, the smaller the resulting impedance, and thus the power signals can be stably transmitted on the power signal lines 520. Further, the interface structure of the wafer test equipment according to the current embodiment of the inventive concept is connected to the universal block printed circuit board 400 while the power signal lines 520 and the normal signal lines 510 respectively maintain the shortest distance relative to the tester head 200 in a perpendicular direction. Accordingly, when a DUT is a product that operates at high speed, test signals can be more reliably transmitted.

Figure 5:
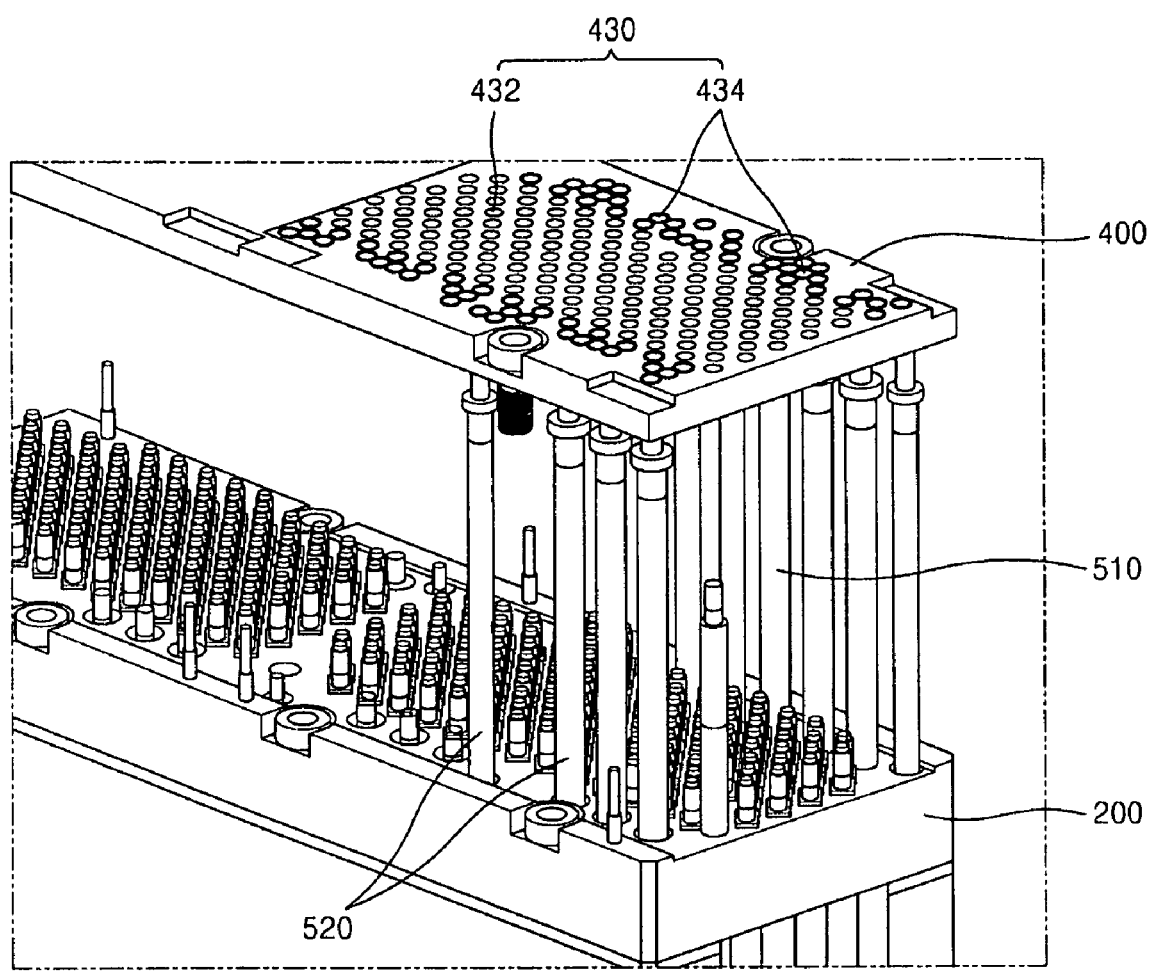
FIG. 5 is a perspective view illustrating a cable assembly and an universal block printed circuit board that are connected to each other, in accordance with embodiments of the present inventive concept.

FIG. 5 is a perspective view illustrating the cable assembly 500 and the universal block printed circuit board 400 that are connected to each other, in accordance with an embodiment of the present inventive concept.

Referring to FIG. 5, the power signal lines 520 directly connected from the tester head 200 to the universal block printed circuit board 400 are divided into multiple paths in the printed circuit patterns 420 of the universal block printed circuit board 400 and thus the connection contact points 434 are formed. Meanwhile, the normal signal lines 510 are directly connected to the connection contact points 432 of the universal block printed circuit board 400 by a ratio of 1:1.

Figure 6:
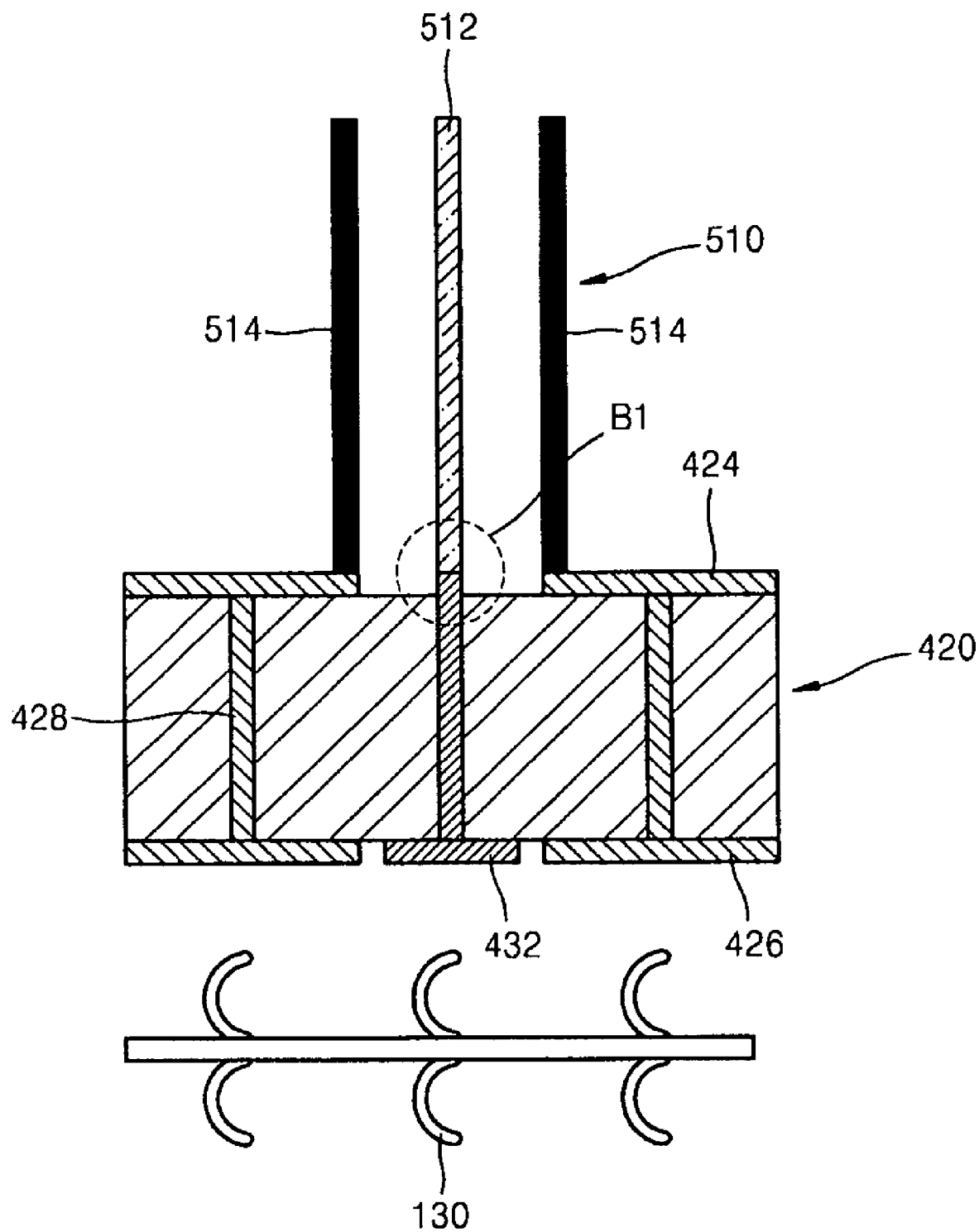
FIGS. 6 through 8 are cross-sectional views illustrating a structure in which normal signal lines of a cable assembly are soldered in a universal block printed circuit board in accordance with embodiments of the present inventive concept.
Figure 7:
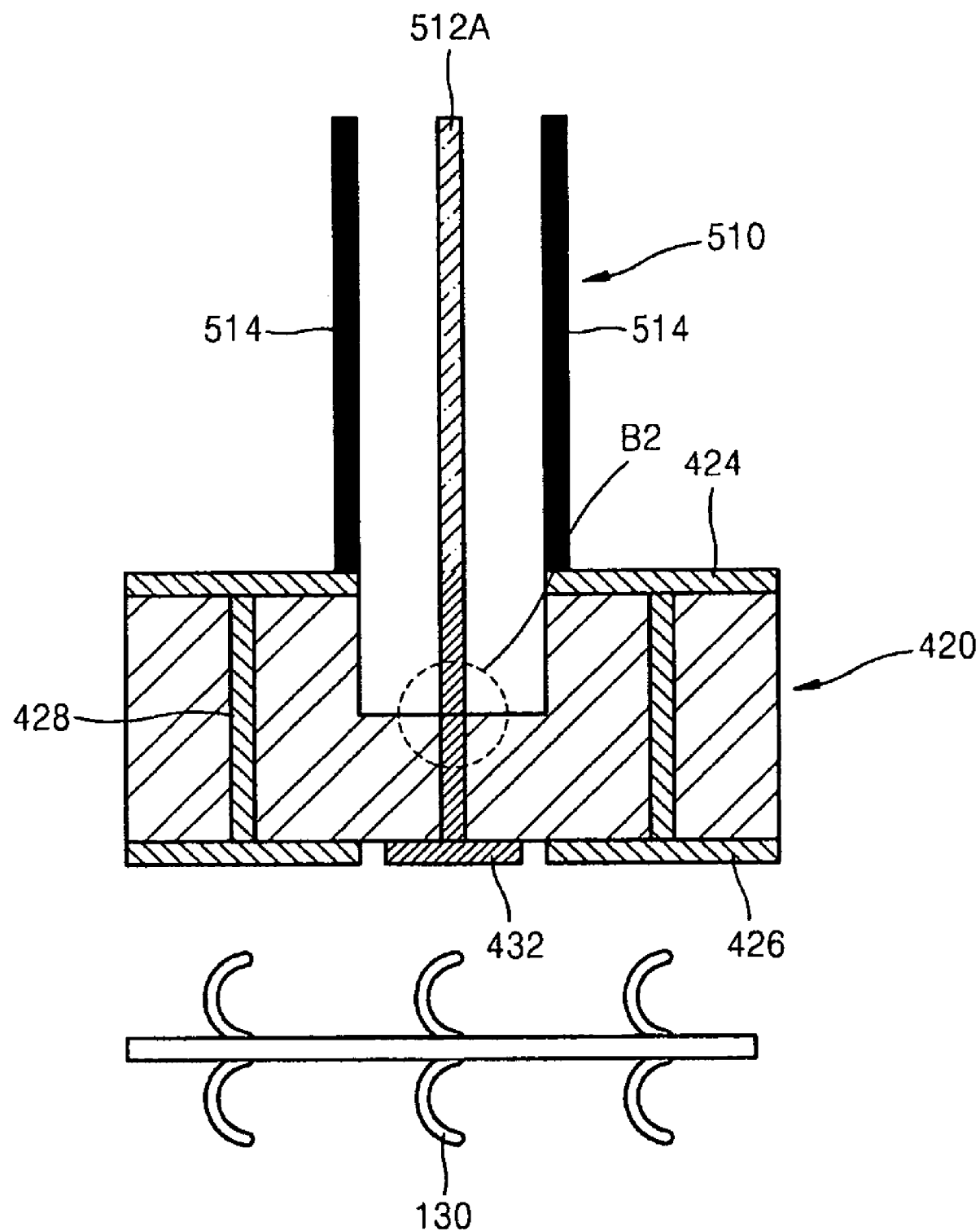
Figure 8:
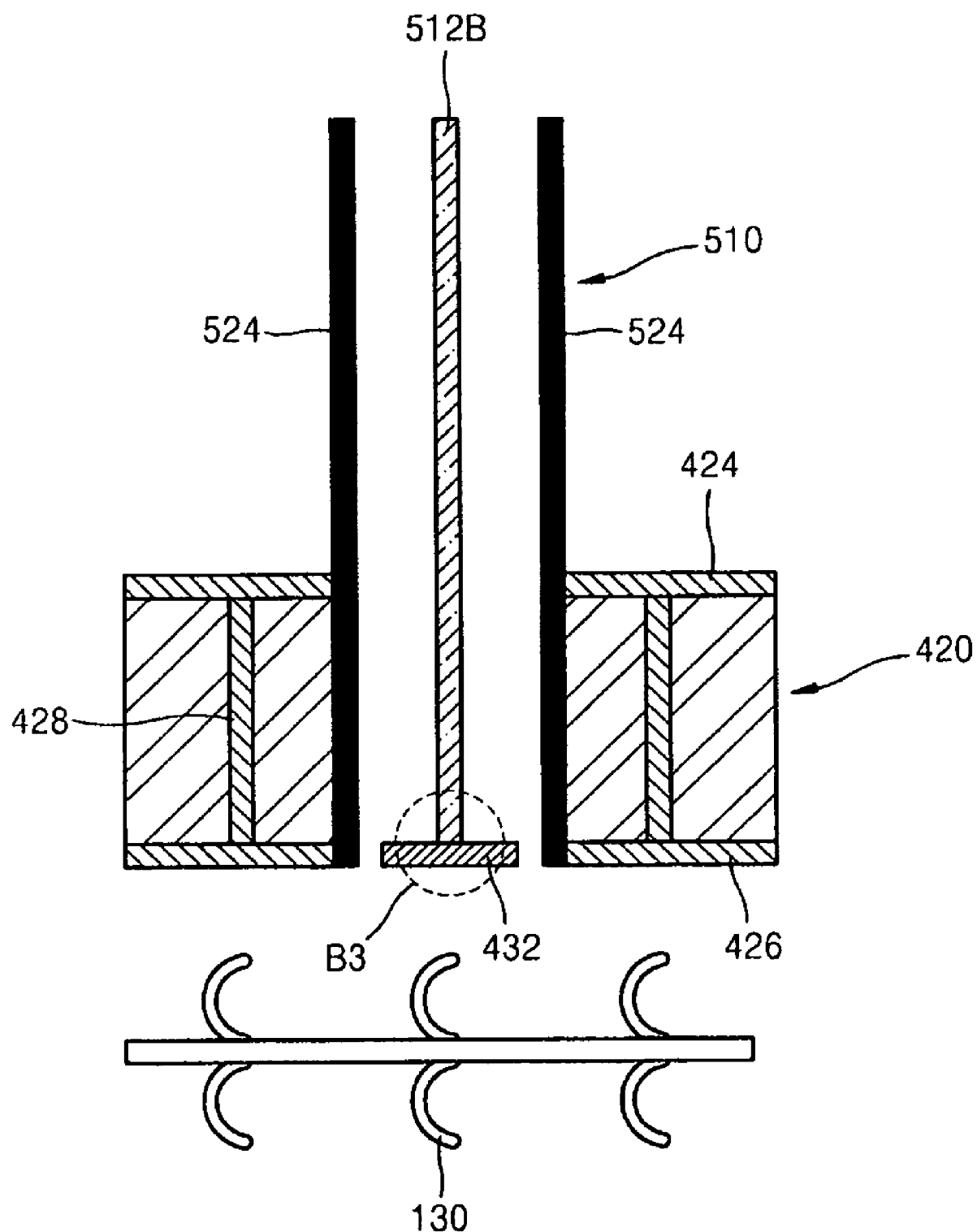

FIGS. 6 through 8 are cross-sectional views illustrating various structures in which a normal signal line 510 of the cable assembly 500 is soldered in the universal block printed circuit board 400 according to an embodiment of the inventive concept.

Referring to FIGS. 6 and 8, signal lines 512, 512A, and 512B included in the normal signal line 510 are surrounded by ground lines 514. The ground lines 514 are connected to ground conductive layers 424 and 426, respectively, positioned on an upper surface and a lower surface of the printed circuit patterns 420 included in the universal block printed circuit board 400. The printed circuit patterns 420 included in the universal block printed circuit board 400 may further include a ground conductive layer 428 that connects the ground conductive layer 424 formed on the upper surface and the conductive layer 426 formed on the lower surface.

Meanwhile, the connection between the normal signal lines 512, 512A, and 512B and the printed circuit patterns 420 included in the universal block printed circuit board 400 may be such that the normal signal line 512 is soldered on an upper surface of the printed circuit patterns 420 as illustrated in B1 of FIG. 6, or that the normal signal line 512A is soldered in a middle portion of the printed circuit patterns 420 as illustrated in B2 of FIG. 7, or that the normal signal line 512B is connected to the connection contact point 432 through the printed circuit patterns 420 as illustrated in B3 of FIG. 8. Accordingly, the normal signal lines 512, 512A, and 512B are directly through-connected to the connection contact points 432 of the printed circuit patterns 420 included in the universal block printed circuit board 400, and are then connected to a DUT through the interposers 130 included in the probe card 100.

Figure 9:
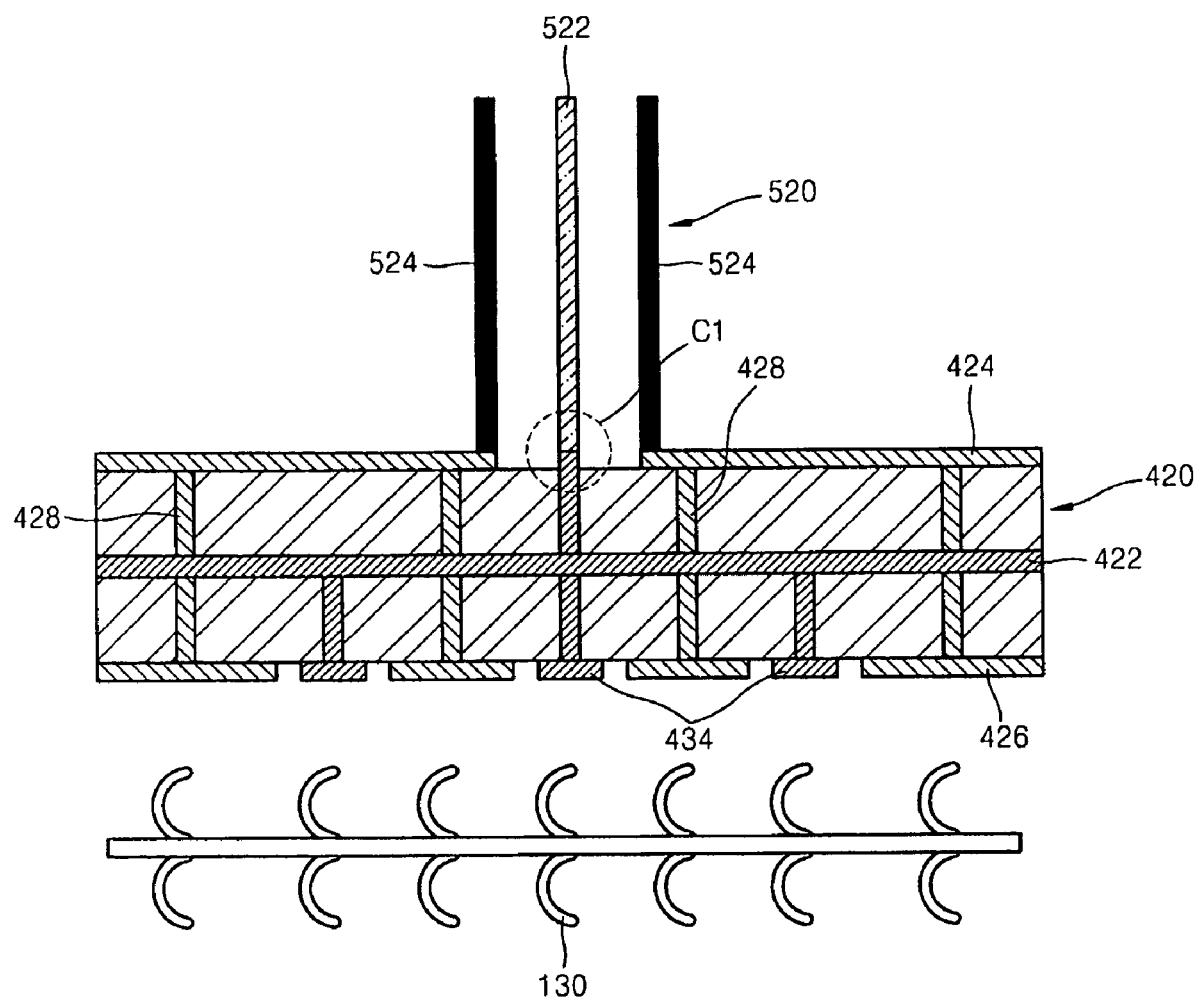
FIGS. 9 and 10 are cross-sectional views illustrating a structure in which power signal lines of a cable assembly are soldered in a universal block printed circuit board in accordance with embodiments of the present inventive concept.
Figure 10:
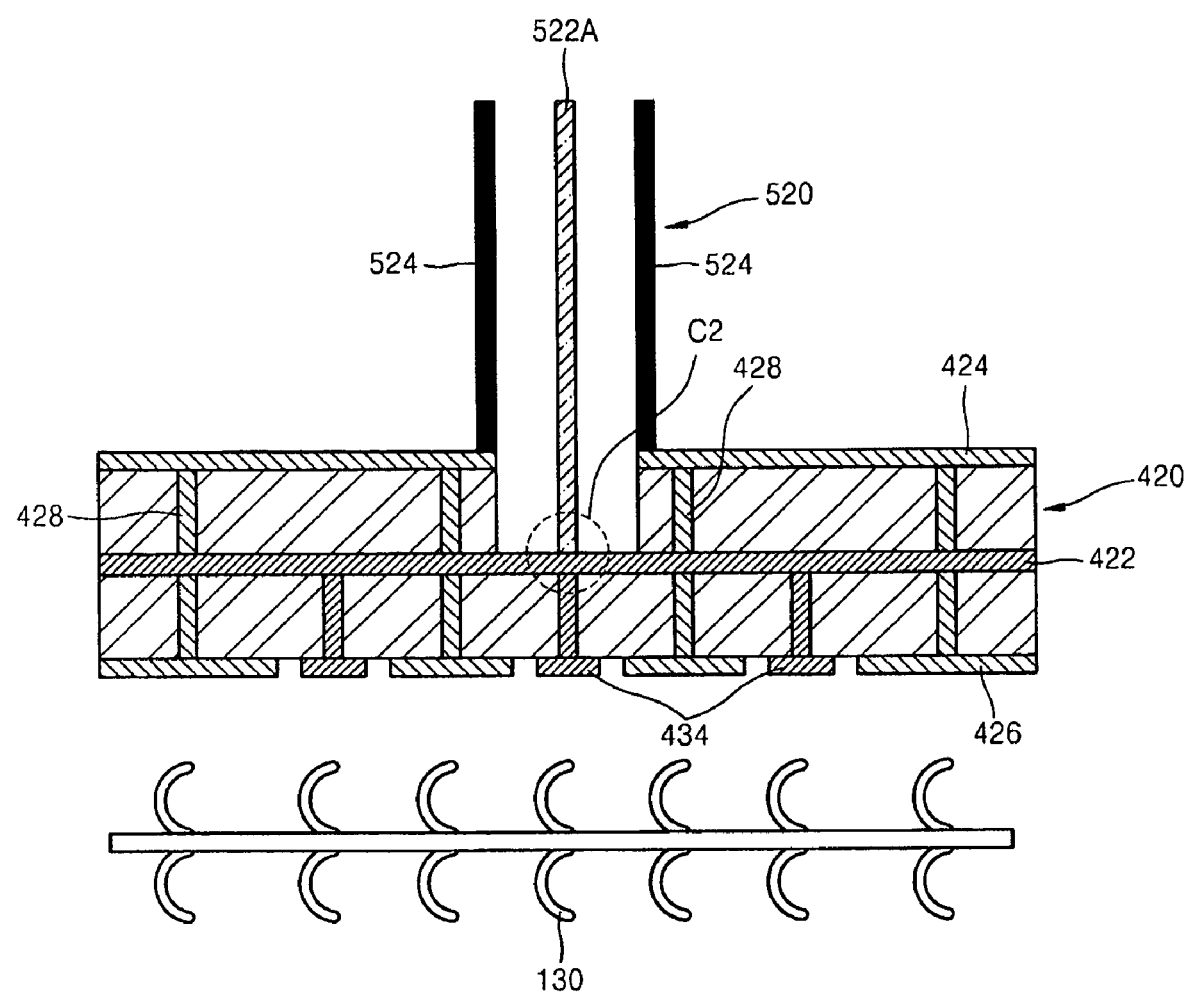

FIGS. 9 and 10 are cross-sectional views illustrating a structure in which the power signal lines 520 of the cable assembly 500 are soldered in the universal block printed circuit board 400 according to an embodiment of the inventive concept.

Referring to FIGS. 9 and 10, like the normal signal lines 510, signal lines 522 and 522A included in the power signal lines 520 of the cable assembly 500 are surrounded by ground lines 524. The ground lines 524 are connected to upper and lower ground conductive layers 424 and 426, respectively, formed in the printed circuit patterns 420 included in the universal block printed circuit board 400. Accordingly, the power signal lines 520 obtain a wide ground area during a connection process, thereby preventing deterioration of the power signal transmission characteristics due to noise. A connection ground line 428 is formed in the printed circuit patterns 420 of the universal block printed circuit board 400.

Meanwhile, the power signal lines 522 and 522A may be electrically connected to the upper surface of the printed circuit patterns 420 of the universal block printed circuit board 400 and be divided into three paths in a ground middle conductive layer 422 formed in the printed circuit patterns 420 as shown in C1 of FIG. 9. Also, the power signal lines 522 and 522A may be connected to the ground middle conductive layer 422 in the printed circuit patterns 420 and be divided into three paths as shown in C2 of FIG. 10. Accordingly, the power signal lines 522 and 522A are divided into multiple paths and are connected to connection contact points 434 of the printed circuit patterns 420 in the universal block printed circuit board 400, and then to a DUT through the interposers 130. The power signal lines 522 and 522a that are arranged parallel in the interface structure of the wafer test equipment according to the current embodiment of the inventive concept significantly reduce impedance of the interface structure of the wafer test equipment, thereby improving the signal transmission characteristics.

According to the inventive concept, first, the size and weight of the probe card that requires manual handling is reduced. This is achieved, in part, by including the relatively heavy printed circuit board as a universal printed circuit board block that forms part of the test head. Accordingly, the weight of the probe card can be reduced, such as reduced by ⅕, and the size thereof can be reduced, such as reduced by ¼, during an actual testing process, so that the probe card is more suited for manual handling by an operator in ergonomic fashion.

Second, a tester divides power signal lines transmitted to semiconductor chips of a wafer that is a DUT into multiple paths in the universal block printed circuit board and increases the number of contact points, thereby reducing power impedance and achieving a more stable power transmission during an electrical test process of the wafer.

Third, a path for connecting the power signal lines and the normal signal lines to the DUT via the printed circuit board of the probe card is designed as the shortest distance from the tester head to the universal block printed circuit board in a perpendicular direction, thereby achieving more stable signal transmission characteristics and increasing reliability of high-speed electrical testing of a semiconductor device.

While the inventive concept has been particularly shown and described with reference to exemplary embodiments thereof, it will be understood that various changes in form and details may be made therein without departing from the spirit and scope of the following claims.

What is claimed is:

1. A wafer test equipment system, comprising:
a performance board connected to a tester head of a tester;
a universal block printed circuit board positioned on the performance board, directly connecting a plurality of normal signal lines to a probe card and dividing each of a plurality of power signal lines into multiple paths and connecting them to the probe card;
a cable assembly transferring the normal signal lines and the power signal lines between the universal block printed circuit board and the tester head, the cable assembly soldered directly to the universal block printed circuit board in a perpendicular direction through a center portion of the performance board; and
a probe card that is removably secured to the performance board including the universal block printed circuit board, the probe card including an interposer on an upper surface thereof, a ceramic multi-layer substrate positioned below the interposer, and a plurality of needles positioned below the ceramic multi-layer substrate on a lower surface thereof opposite the upper surface,
wherein the performance board and the probe card are electrically connected at a plurality of connection contact points at a lower surface of the universal block printed circuit board at a lower portion of the performance board, and wherein the connection contact points correspond with interposer terminals of the interposer of the probe card on the upper surface of the probe card, and
wherein the universal block printed circuit board has a matrix structure including a plurality of blocks of printed circuit patterns and wherein each block includes the connection contact points that are provided on the lower surfaces of the printed circuit patterns.

2. The wafer test equipment system of claim 1, wherein the normal signal lines and the connection contact points are directly connected to each other according to a 1:1 signal transfer ratio, and wherein the power signal lines and the connection contact points are connected to each other according to a 1:N signal transfer ratio, where N is a whole number greater than 1.

3. The wafer test equipment system of claim 1, wherein the probe card has a configuration that varies in accordance with the part type of a semiconductor device that is to be tested.

4. The wafer test equipment system of claim 1, wherein the normal signal lines in the cable assembly are connected to a conductive layer in a middle portion of the universal block printed circuit board.

5. The wafer test equipment system of claim 1, wherein the normal signal lines in the cable assembly are connected through the universal block printed circuit board.

6. A wafer test equipment system, comprising:
a performance board connected to a tester head of a tester;
a universal block printed circuit board positioned on the performance board, directly connecting a plurality of normal signal lines to a probe card and dividing each of a plurality of power signal lines into multiple paths and connecting them to the probe card;
a cable assembly transferring the normal signal lines and the power signal lines between the universal block printed circuit board and the tester head, the cable assembly soldered directly to the universal block printed circuit board in a perpendicular direction through a center portion of the performance board; and
a probe card that is removably secured to the performance board including the universal block printed circuit board, the probe card including an interposer on an upper surface thereof, a ceramic multi-layer substrate positioned below the interposer, and a plurality of needles positioned below the ceramic multi-layer substrate on a lower surface thereof opposite the upper surface,
wherein the performance board and the probe card are removably secured to each other via levers of a ZIF connector at an outer portion of the probe card that surrounds the interposer.

7. The wafer test equipment system of claim 6, wherein the probe card further comprises a support surrounding the ceramic multi-layer substrate; and wherein the levers of the ZIF connector are positioned on the support.

8. The wafer test equipment system of claim 7, wherein the probe card is exclusive of a printed circuit board.

9. A wafer test equipment system, comprising:
a performance board connected to a tester head of a tester;
a universal block printed circuit board positioned on the performance board, directly connecting a plurality of normal signal lines to a probe card and dividing each of a plurality of power signal lines into multiple paths and connecting them to the probe card;
a cable assembly transferring the normal signal lines and the power signal lines between the universal block printed circuit board and the tester head, the cable assembly soldered directly to the universal block printed circuit board in a perpendicular direction through a center portion of the performance board; and
a probe card that is removably secured to the performance board including the universal block printed circuit board, the probe card including an interposer on an upper surface thereof, a ceramic multi-layer substrate positioned below the interposer, and a plurality of needles positioned below the ceramic multi-layer substrate on a lower surface thereof opposite the upper surface,
wherein the power signal lines in the cable assembly are soldered directly to an upper surface of the universal printed circuit board of the performance board.

10. The wafer test equipment system of claim 1, wherein the power signal lines in the cable assembly are connected to a conductive layer in a middle portion of the universal block printed circuit board.

11. A wafer test equipment system, comprising:
a performance board connected to a tester head of a tester;
a universal block printed circuit board positioned on the performance board, directly connecting a plurality of normal signal lines to a probe card and dividing each of a plurality of power signal lines into multiple paths and connecting them to the probe card;
a cable assembly transferring the normal signal lines and the power signal lines between the universal block printed circuit board and the tester head, the cable assembly soldered directly to the universal block printed circuit board in a perpendicular direction through a center portion of the performance board; and
a probe card that is removably secured to the performance board including the universal block printed circuit board, the probe card including an interposer on an upper surface thereof, a ceramic multi-layer substrate positioned below the interposer, and a plurality of needles positioned below the ceramic multi-layer substrate on a lower surface thereof opposite the upper surface, wherein the normal signal lines in the cable assembly are soldered directly to an upper surface of the universal printed circuit board of the performance board.

12. A wafer test equipment system, comprising:

a performance board connected to a tester head of a tester;

a universal block printed circuit board positioned on the performance board, directly connecting a plurality of normal signal lines to a probe card and dividing each of a plurality of power signal lines into multiple paths and connecting them to the probe card;

a cable assembly transferring the normal signal lines and the power signal lines between the universal block printed circuit board and the tester head, the cable assembly soldered directly to the universal block printed circuit board in a perpendicular direction through a center portion of the performance board; and a probe card that is removably secured to the performance board including the universal block printed circuit board, the probe card including an interposer on an upper surface thereof, a ceramic multi-layer substrate positioned below the interposer, and a plurality of needles positioned below the ceramic multi-layer substrate on a lower surface thereof opposite the upper surface, wherein ground lines surround the outer portions of the power signal lines and the normal signal lines in the cable assembly, and are connected to ground conductive layers, respectively, formed on an upper surface and a lower surface of the universal block printed circuit board.

* * * * *